US012598933B2

(12) United States Patent
Marion et al.

(10) Patent No.: US 12,598,933 B2
(45) Date of Patent: Apr. 7, 2026

(54) SEMICONDUCTOR DEVICES AND METHODS OF MANUFACTURING THE SAME

(71) Applicant: Tokyo Electron Limited, Tokyo (JP)

(72) Inventors: Jason Marion, Albany, NY (US);
Alexander Kaiser, Albany, NY (US);
Yusuke Yoshida, Albany, NY (US);
Yun Han, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 312 days.

(21) Appl. No.: 18/241,773

(22) Filed: Sep. 1, 2023

(65) Prior Publication Data

US 2025/0079184 A1     Mar. 6, 2025

(51) Int. Cl.
| | |
|---|---|
| *H01L 21/3213* | (2006.01) |
| *H01L 21/3205* | (2006.01) |
| *H01L 21/321* | (2006.01) |
| *H10D 30/01* | (2025.01) |
| *H10D 64/01* | (2025.01) |

(52) U.S. Cl.
CPC .. *H01L 21/32139* (2013.01); *H01L 21/32055* (2013.01); *H01L 21/3211* (2013.01); *H10D 30/024* (2025.01); *H10D 64/01* (2025.01)

(58) Field of Classification Search
None
See application file for complete search history.

(56) References Cited

U.S. PATENT DOCUMENTS

| | | |
|---|---|---|
| 2013/0237059 A1 | 9/2013 | Ranjan et al. |
| 2013/0260561 A1 | 10/2013 | Ranjan et al. |
| 2020/0075734 A1 | 3/2020 | Thomas et al. |
| 2021/0074591 A1* | 3/2021 | Chen .................... H10D 64/018 |
| 2021/0351281 A1* | 11/2021 | Lin ...................... H10D 64/518 |

FOREIGN PATENT DOCUMENTS

KR     10-2008-0099689 A     11/2008

OTHER PUBLICATIONS

International Search Report and Written Opinion on International Application No. PCT/US2024/036332 dated Oct. 22, 2024 (10 pages).

* cited by examiner

*Primary Examiner* — Binh X Tran
(74) *Attorney, Agent, or Firm* — Foley & Lardner LLP

(57) ABSTRACT

A method includes providing a semiconductor substrate and forming a fin protruding from the semiconductor substrate. The method includes forming a silicon-containing layer over the fin. The method further includes patterning the silicon-containing layer to form a gate structure over the fin, where patterning the silicon-containing layer is implemented using an etchant and a passivant that includes a silicon-containing gas and a nitrogen-containing gas.

20 Claims, 15 Drawing Sheets

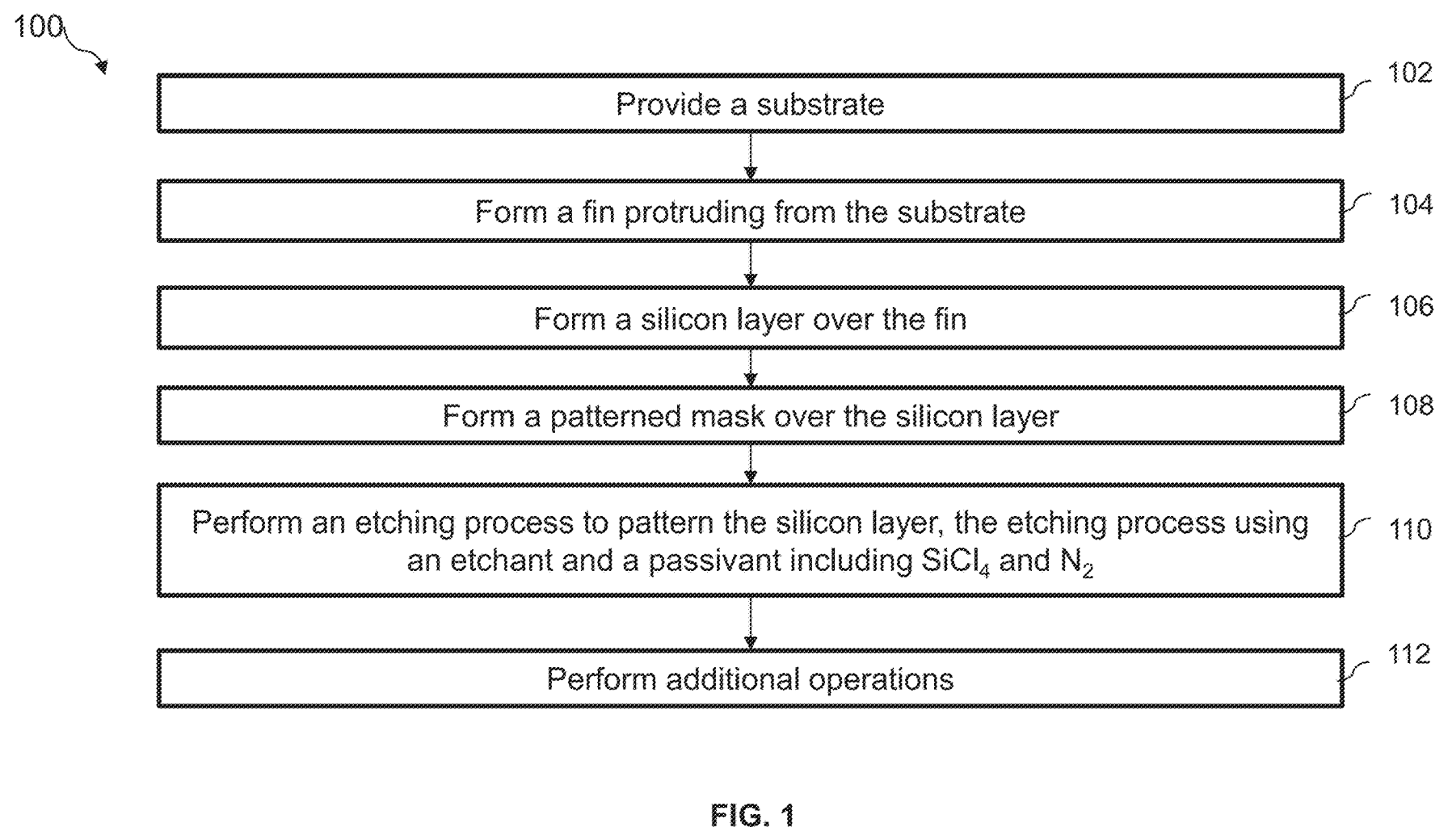

100

102

Provide a substrate

104

Form a fin protruding from the substrate

106

Form a silicon layer over the fin

108

Form a patterned mask over the silicon layer

110

Perform an etching process to pattern the silicon layer, the etching process using an etchant and a passivant including $SiCl_4$ and $N_2$

112

Perform additional operations

FIG. 1

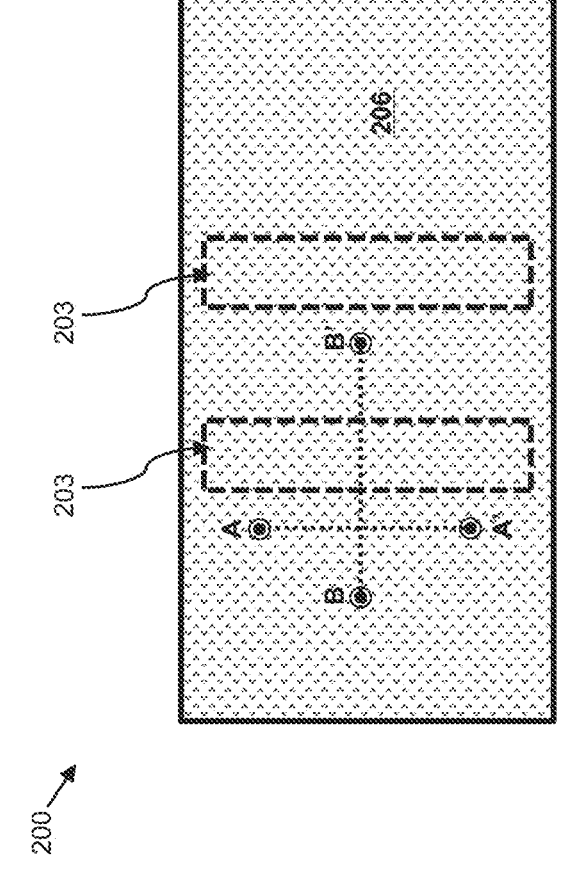
FIG. 2
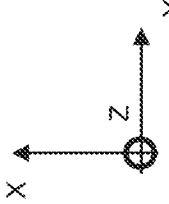

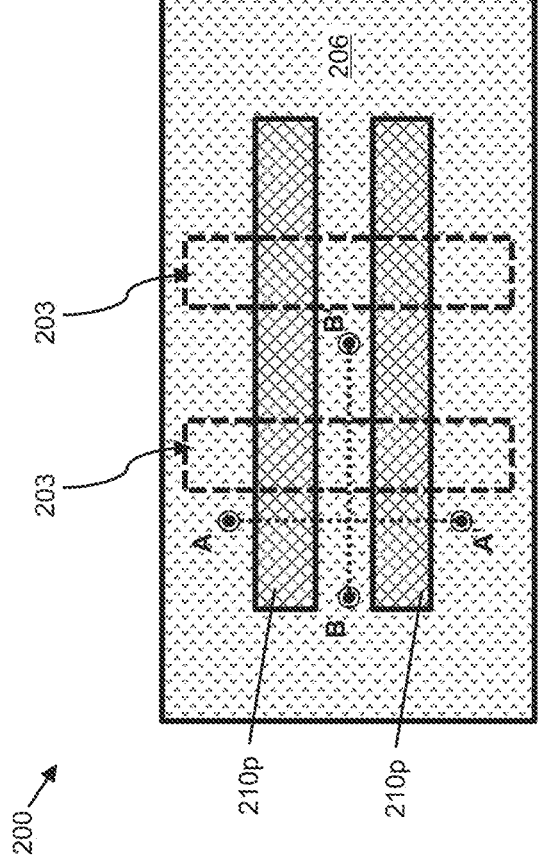
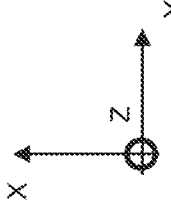
FIG. 8

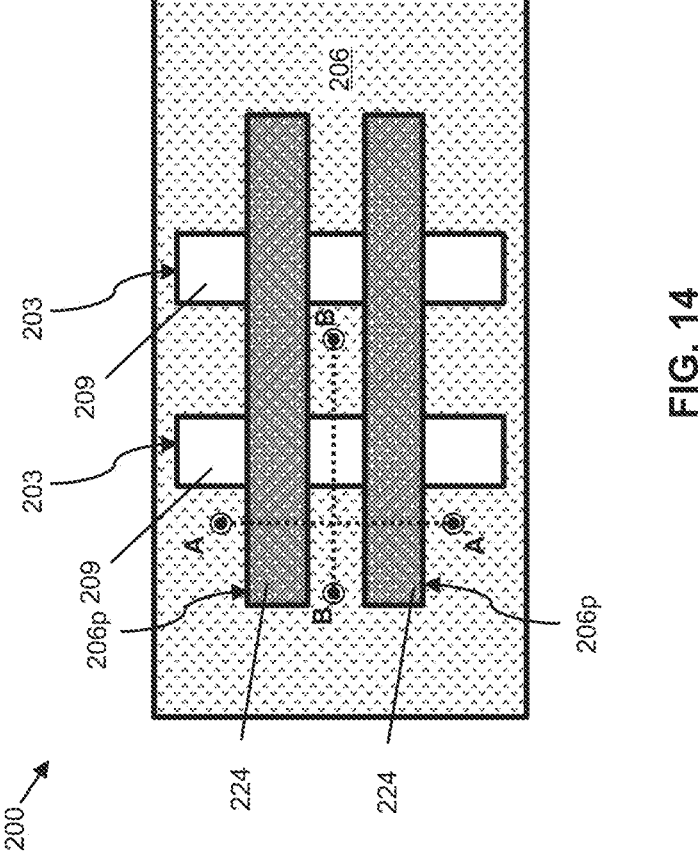
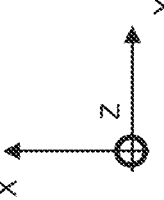
FIG. 14

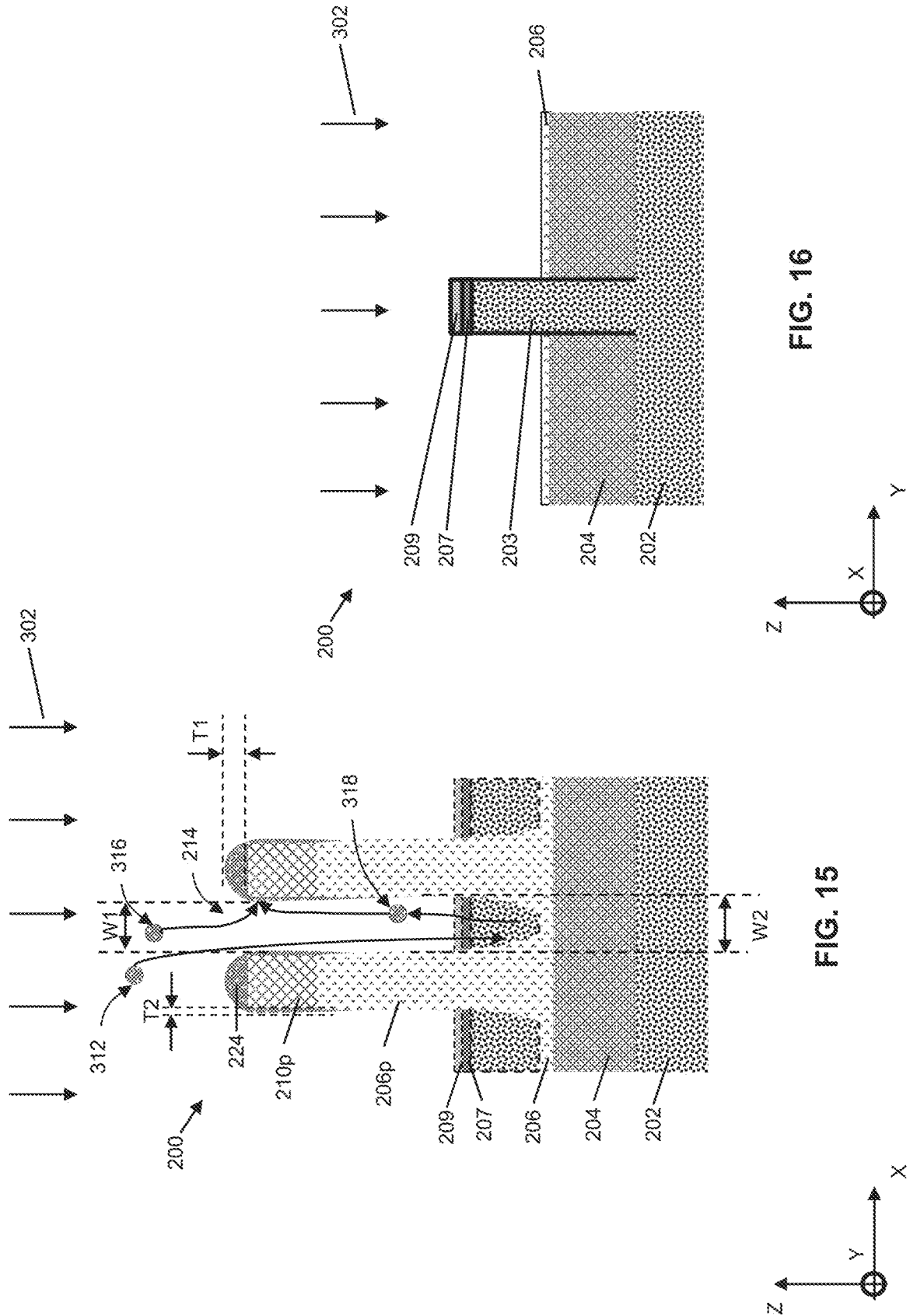

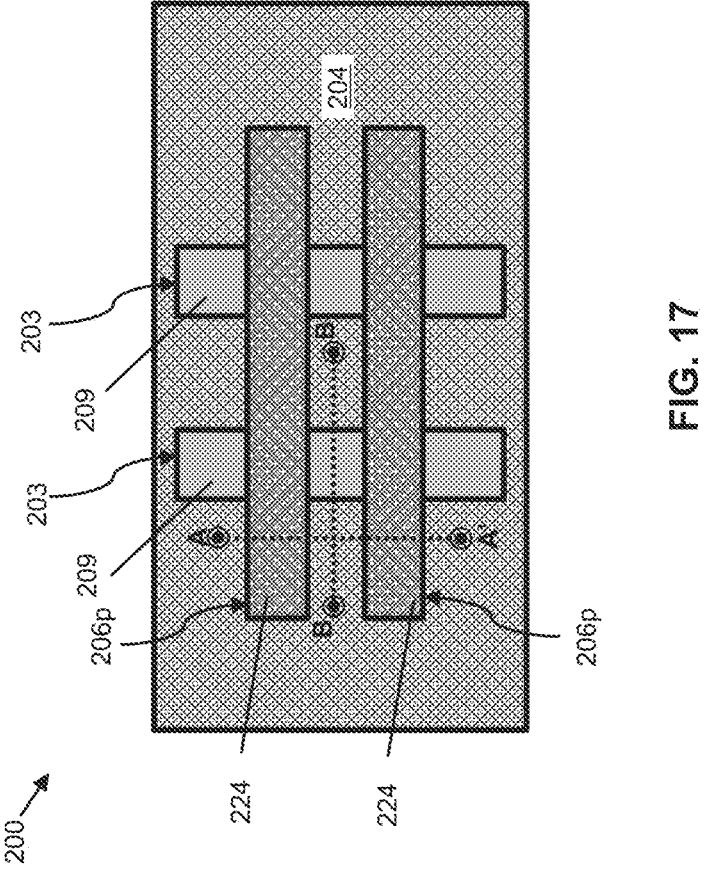
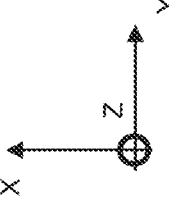
FIG. 17

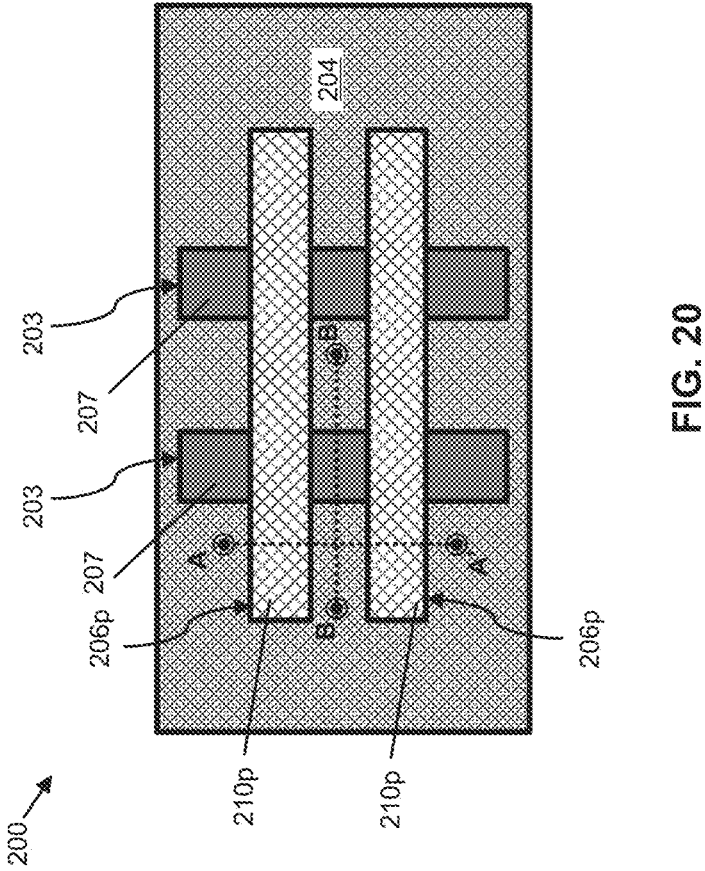
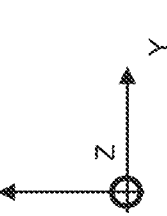
FIG. 20

SEMICONDUCTOR DEVICES AND METHODS OF MANUFACTURING THE SAME

FILED OF THE DISCLOSURE

This disclosure relates to methods of manufacturing semiconductor devices and more particularly to methods of etching a semiconductor material with improved etching selectivity and profile control.

BACKGROUND

In the manufacture of a semiconductor devices (especially on the microscopic scale), various fabrication processes are executed, including, for example, film-forming depositions, etch mask creation, patterning, material etching and removal, and doping treatments. These processes are performed repeatedly to form desired semiconductor device elements on a substrate. In recent development, it has become increasingly important to merge and/or compact fabrication steps to reduce processing complexity, cost, and/or time. However, as device features continue to decrease in critical dimension (CD), many challenges arise with respect to performing one or more of the processes described above to achieve specific design goals. For example, patterning a silicon layer to form a three-dimensional gate structure has become an important integration approach for the semiconductor industry. While existing methods of etching the silicon layer have generally been adequate, they are not entirely satisfactory in all aspects.

SUMMARY

Described herein are methods of implementing etching processes for forming semiconductor devices.

In one aspect, the present disclosure may provide a method that includes providing a semiconductor substrate and forming a fin protruding from the semiconductor substrate. The method includes forming a silicon-containing layer over the fin. The method further includes patterning the silicon-containing layer to form a gate structure over the fin, where patterning the silicon-containing layer is implemented using an etchant and a passivant that includes a silicon-containing gas and a nitrogen-containing gas.

In some implementations, the silicon-containing gas includes a halogen and the nitrogen-containing gas includes $N_2$. In some implementations, the passivant is free of any oxygen-containing gas.

In some implementations, the method further includes forming a patterned mask over the silicon-containing layer such that patterning the silicon-containing layer removes portions of the semiconductor layer exposed by the patterned mask.

In some implementations, patterning the silicon-containing layer causes the passivant to react with the silicon-containing layer to form a passivation layer that includes at least one silicon nitride (SiN)-containing material. In some implementations, the passivation layer includes $Si_xNBr_y$ and one of $Si_xNCl_y$ or $Si_xNF_y$, where x and y are greater than 0. In some implementations, a portion of the passivation layer is formed to have a thickness that decreases along a sidewall of the gate structure toward a top surface of the semiconductor substrate. In some implementations, a portion of the passivation layer is formed to have a domed profile over a top surface of the gate structure.

In another aspect, the present disclosure provides a method that includes providing a semiconductor substrate and forming a fin protruding from the semiconductor substrate. The method includes depositing a silicon layer over the fin. The method further includes etching the silicon layer to form a gate structure using an etchant and a passivant, where etching the silicon layer forms a silicon-nitride-containing passivation layer over a top portion of a sidewall of the gate structure.

In some implementations, the method further includes forming a patterned mask over the silicon layer before etching the silicon layer and removing the passivation layer after etching the silicon layer. In some implementations, etching the silicon layer includes depositing the passivant using a chemical vapor deposition (CVD) process. In some implementations, a bottom portion of the sidewall of the gate structure is free of the passivation layer.

In some implementations, the etchant includes $Cl_2$, HBr, or a combination thereof. In some implementations, the etchant reacts with the silicon layer to form a product having a same composition as the passivant.

In some implementations, the passivation layer includes at least one halogen-containing silicon nitride. In some implementations, a composition of the passivants is free of oxygen.

In yet another aspect, the present disclosure provides a method that includes providing a semiconductor substrate and forming a fin protruding from the semiconductor substrate. The method includes depositing a silicon layer over the fin. The method includes forming a patterned mask over the silicon layer. The method further includes etching portions of the silicon layer exposed by the patterned mask to form a gate structure, where etching the portions of the silicon layer is implemented using an etchant and a passivant, resulting in a silicon-nitride-containing passivation layer over a sidewall of the gate structure.

In some implementations, the passivant includes $N_2$ and a silicon-and-halogen-containing gas, is the passivant being free of any oxygen-containing gas.

In some implementations, the passivation layer is formed to have a thickness that decreases along the sidewall of the gate structure below the patterned mask. In some implementations, a bottommost portion of the sidewall of the gate structure is free of the passivation layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIG. 1 illustrates a flowchart of an example method of fabricating a semiconductor structure, in accordance with some implementations.

FIGS. 2, 5, 8, 11, 14, 17, and 20 each illustrate a planar top view of an example semiconductor structure at intermediate steps of the method illustrated in FIG. 1, in accordance with some implementations.

FIGS. 3, 6, 9, 12, 15, 18, and 21 each illustrate a cross-sectional view of the example semiconductor structure along line AA' of FIGS. 2, 5, 8, 11, 14, 17, and 20, respectively, at intermediate steps of the method illustrated in FIG. 1, in accordance with some implementations.

FIGS. 4, 7, 10, 13, 16, 19, and 22 each illustrate a cross-sectional view of the example semiconductor structure along line BB' of FIGS. 2, 5, 8, 11, 14, 17, and 20, respectively, at intermediate steps of the method illustrated in FIG. 1, in accordance with some implementations.

DETAILED DESCRIPTION

Figures 3, 4:
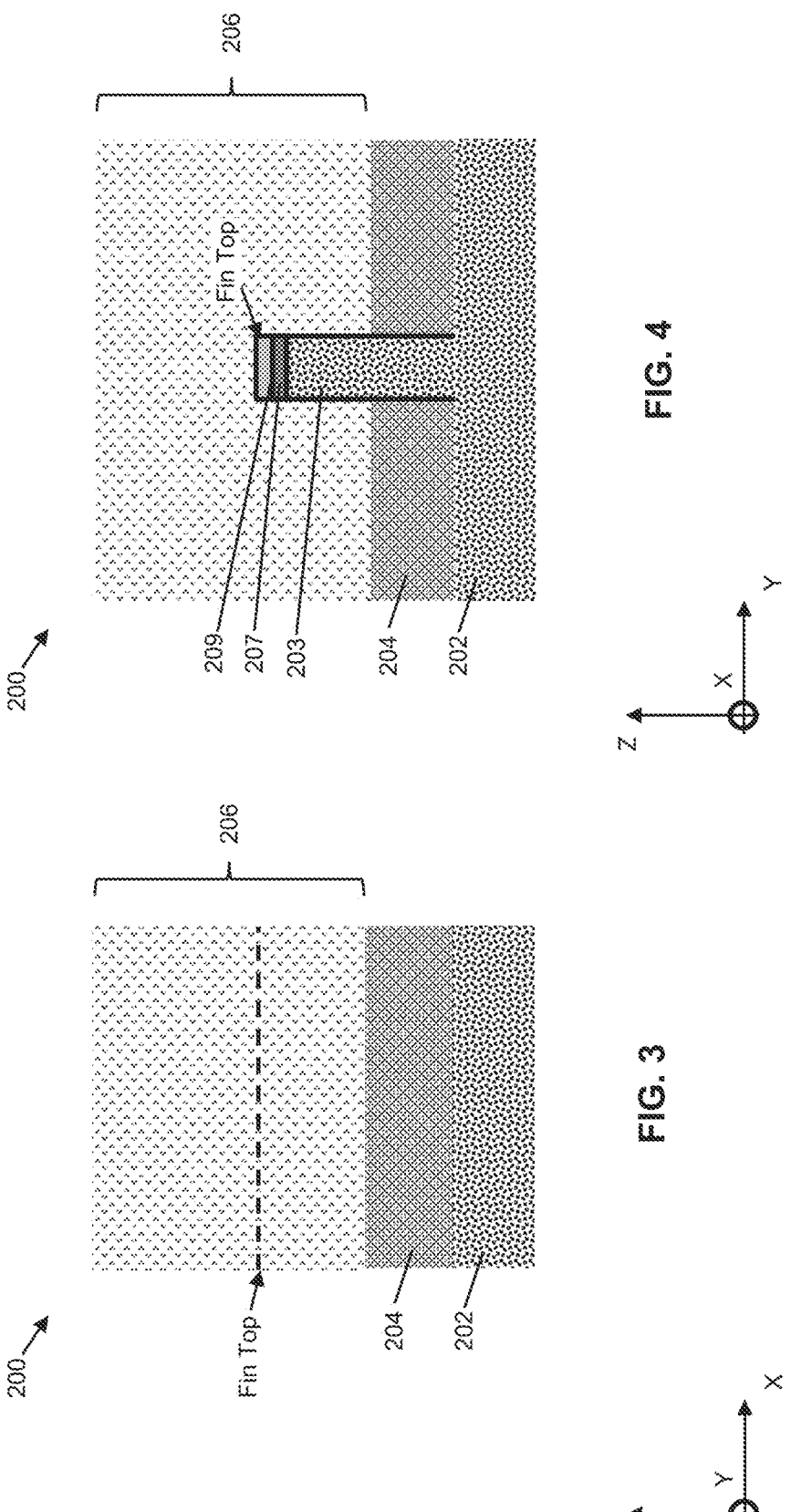

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

FIG. 1 illustrates a flowchart of an example method 100 for fabricating a semiconductor structure, according to some implementations of the present disclosure. The method 100 is described in reference to FIGS. 2-22, which illustrate planar top views and corresponding cross-sectional views of a semiconductor structure 200 during intermediate steps of the method 100, according to some implementations of the present disclosure. It is noted that the method 100 is merely an example and is not intended to limit the present disclosure. It is further understood that additional operations may be provided before, during, and after each of the method 100 and that some other operations may only be briefly described herein.

Referring to FIGS. 1-4, the method 100 at operation 102 provides the semiconductor structure 200 that includes a substrate 202.

The substrate 202 may include a semiconductor material, such as a bulk semiconductor, a semiconductor-on-insulator (SOI), or the like, which may be doped (e.g., with a p-type or an n-type dopant) or undoped. The substrate 202 may be or correspond to a wafer, such as a silicon wafer. Generally, an SOI includes a layer of a semiconductor material formed on an insulator layer. The insulator layer may be, for example, a buried oxide (BOX) layer, a silicon oxide layer, or the like. The substrate 202 may include other semiconductor materials, such as a multi-layered or gradient semiconductor material. In some examples, the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; other suitable materials; or combinations thereof.

The semiconductor structure 200 may further include hard masks disposed over the substrate 202 to protect underlying structures (e.g., fins 203) during subsequent operations. In some implementations, the semiconductor structure includes a first hard mask 207 and a second hard mask 209 overlying the first hard mask 207. The first hard mask 207 and the second hard mask 209 may each include a dielectric material selected from an oxide (e.g., silicon oxide) and a nitride (e.g., silicon nitride (SiN), silicon oxynitride (SiON), silicon carbonitride (SiCN), the like, or combinations thereof). In the present implementations, the first hard mask 207 and the second hard mask 209 have different compositions. In an example implementation, the first hard mask 207 includes a nitride and the second hard mask 209 includes an oxide. In another example implementation, the first hard mask 207 includes an oxide and the second hard mask 209 includes a nitride. The first hard mask 207 and the second hard mask 209 may each be deposited using chemical vapor deposition (CVD), atomic layer deposition (ALD), low-pressure chemical vapor deposition (LPCVD), plasma-enhanced chemical vapor deposition (PECVD), chemical oxidation, thermal oxidation, spin-on coating, or other suitable methods.

Still referring to FIGS. 1-4, the method 100 at operation 104 forms fin active regions (hereafter referred to as fins) 203 over the substrate 202, where the fins 203 are configured to provide a number of device features (e.g., transistors, diodes, or resistors.) in and/or over the substrate 202. In the present implementations, the fins 203 are non-planar, three-dimensional (3D) structures that protrude from the substrate 202 along the Z axis and are oriented lengthwise along the X axis. In some implementations, the fins 203 are configured to form FinFETs over the substrate 202.

The fin 203 may be formed by first patterning the first hard mask 207 and the second hard mask 209 using, for example, photolithography and etching techniques. Generally, photolithography techniques utilize a photoresist material (not depicted) that is deposited over the first hard mask 207 and the second hard mask 209, irradiated by a light source, and developed to remove a portion of the photoresist material, thereby forming a patterned hard mask (not depicted) including a patterned first hard mask 207 and a patterned second hard mask 209. After completing the patterning process, the photoresist material is removed using any suitable method, such as plasma ashing or resist stripping. The patterned mask is subsequently used to pattern the substrate 202 by an etching process that results in trenches formed in the substrate 202, where each trench separates two adjacent fins 203. The etching process may include a dry etching process, a wet etching process, a reactive ion etching (RIE) process, a neutral beam etching (NBE) process, the like, or combinations thereof. The etching process may be anisotropic. Other suitable processes of forming the fins 203 may also be applicable according to implementations of the present disclosure.

Subsequently, the method 100 forms a dielectric layer 204 on or overlaying the substrate 202 to isolate adjacent fins 203.

In the present implementations, the dielectric layer 204 includes an oxide, such as SiO$_2$, a nitride, such as SiN, a low-k dielectric material (e.g., a dielectric material having a dielectric constant less than that of silicon oxide, which is about 3.9), the like, or combinations thereof. The dielectric layer 204 may be formed or deposited using at least one suitable technique, such as CVD, flowable CVD (FCVD), ALD, physical vapor deposition (PVD), spin coating, the like, or combinations thereof. In some implementations, the dielectric layer 204 includes isolation features, such as shallow-trench isolation (STI) features, configured to isolate the fins 203 (e.g., bottom portions of the fins 203) that protrude from the substrate 202.

Still referring to FIGS. 1-4, the method 100 at operation 106 forms a silicon-containing layer 206 over the dielectric layer 204 and over the fins 203.

In the present implementations, the silicon-containing layer (e.g., a silicon layer) 206 includes elemental silicon. In some implementations, the silicon-containing layer 206 consists essentially of elemental silicon. In some implementations, the silicon-containing layer 206 and the fins 203 include silicon of different crystallographic structures. For example, the fins 203 may include single-crystal silicon and the silicon-containing layer 206 includes polycrystalline silicon, or polysilicon. The silicon-containing layer 206 may be deposited by any suitable process, such as CVD, LPCVD, PECVD, the like, or combinations thereof.

In some implementations, the silicon-containing layer 206 is deposited as a blanket layer over the semiconductor structure 200, as shown in FIGS. 2 and 4, and then patterned to form a gate structure (e.g., gate structure 206p) that overlays a channel region of each fin 203. In this regard, the silicon-containing layer 206 encapsulate a top portion of the fins 203 such that a top surface of the fin 203, or a fin top as indicated in FIGS. 3 and 4, is located below a top surface of the silicon-containing layer 206 as depicted in FIG. 4. In some examples, the gate structure may be subsequently replaced with a metal gate structure after forming source/drain features (not depicted) adjacent the channel region in the fin 203. In this regard, the gate structure is considered a dummy or placeholder gate structure. In some examples, the gate structure may remain in the semiconductor structure 200 such that the gate structure is configured to provide an active device (e.g., a transistor). In this regard, the gate structure is considered an active gate structure. The present disclosure provides methods of patterning the silicon-containing layer 206 to form the gate structure with improved sidewall profile control and etching selectivity with respect to the surrounding features.

Figure 5:
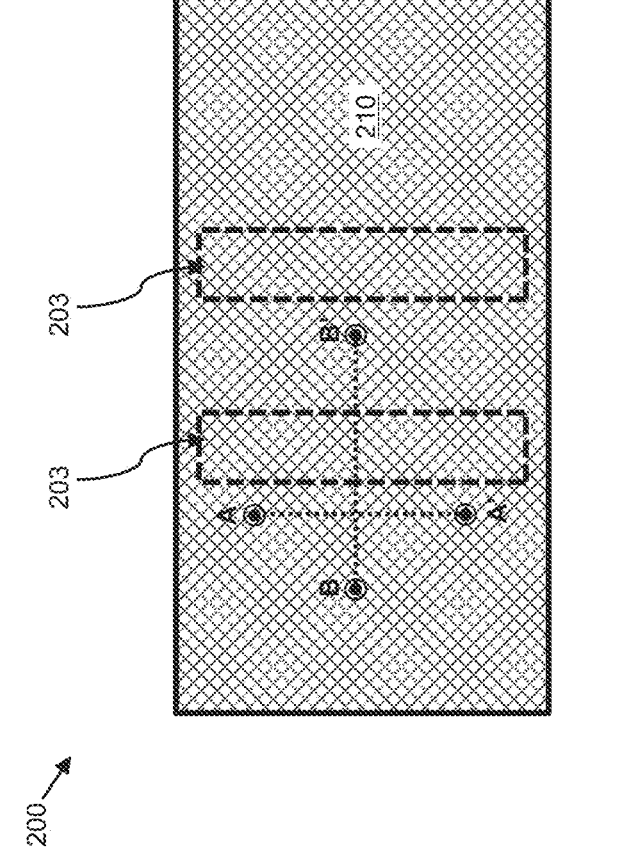
Figures 6, 7:
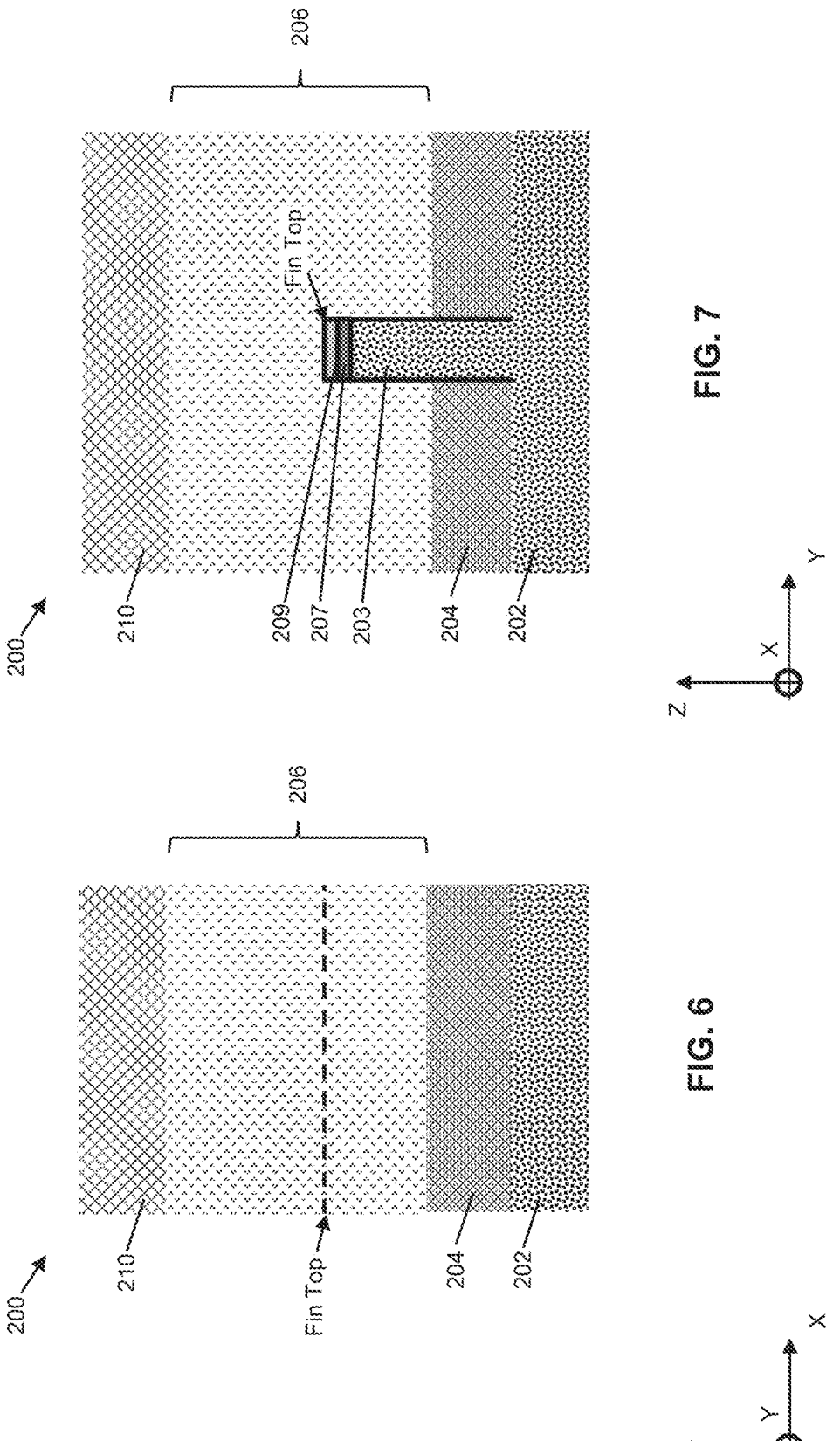

Referring to FIGS. 1 and 5-10, the method 100 at operation 108 forms a patterned mask 210p over the silicon-containing layer 206. Referring to FIGS. 5-7, the method 100 first forms a third hard mask 210 over the silicon-containing layer 206. The third hard mask 210 may include any suitable dielectric material that exhibits etching selectivity with respect to the underlying silicon-containing layer 206 and the second hard mask 209. For example, the third hard mask 210 may include SiN, $SiO_2$, SiCN, SiON, silicon carbide (SiC), the like, or combinations thereof. In this regard, the third hard mask 210 has a composition that is different from that of the dielectric layer 204 and the silicon-containing layer 206. The third hard mask 210 may be formed as a blank layer over the semiconductor structure 200 using any suitable deposition technique, such as CVD, ALD, PVD, spin coating, the like, or combinations thereof.

Figures 9, 10:
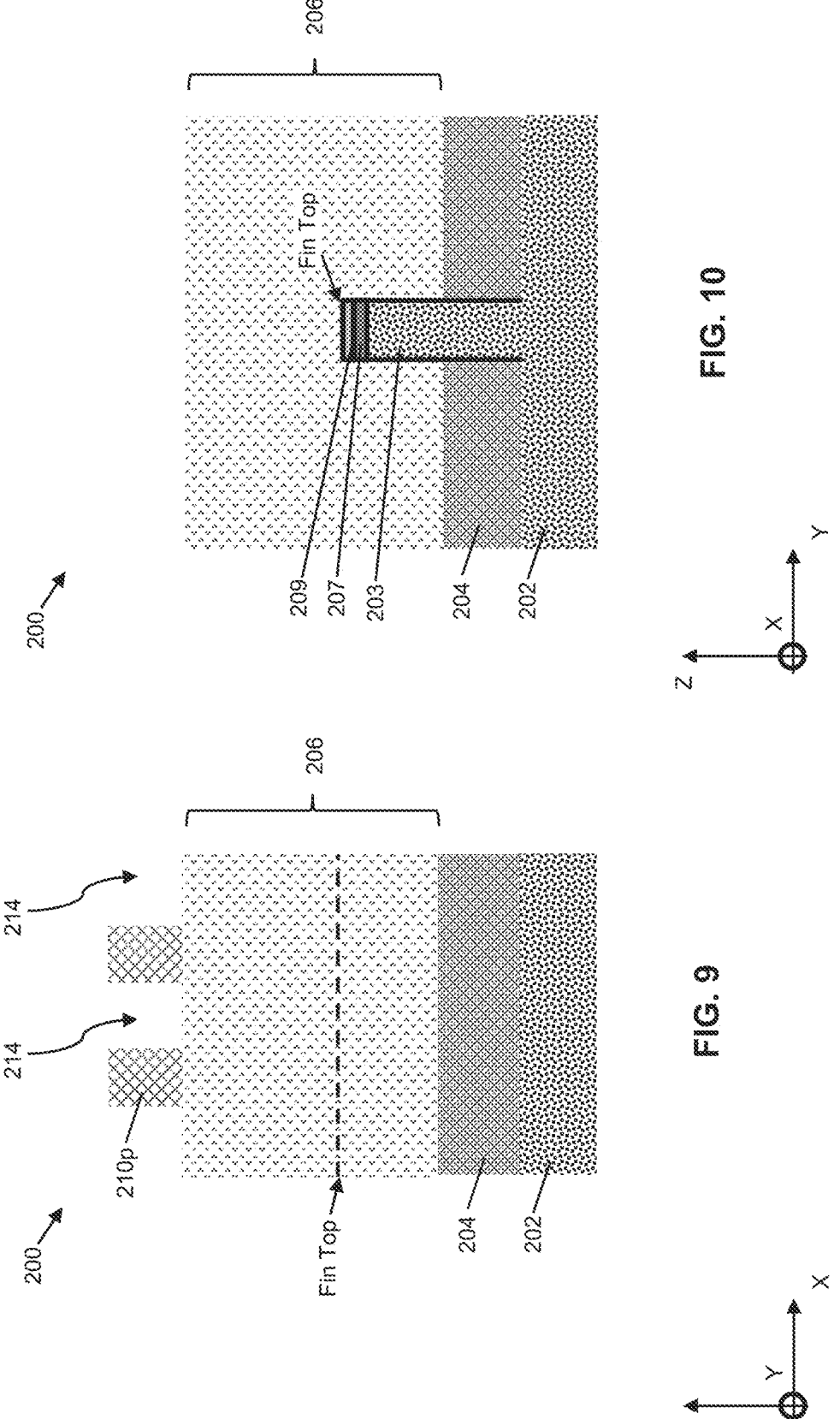

Referring to FIGS. 8-10, the method 100 then patterns the third hard mask 210 to form the patterned mask 210p. The patterned mask 210p may be formed using a series of lithography and etching processes, which include forming a photoresist layer (not depicted) over the third hard mask 210, exposing the photoresist layer to alight source, developing the photoresist layer to form a patterned photoresist layer, etching the third hard mask 210 using the patterned photoresist layer as an etch mask to form the patterned mask 210p, and subsequently removing the patterned photoresist layers by a suitable method, such as resist stripping or plasma ashing. In the present implementations, the patterned mask 210p is formed to include a plurality of trenches 214 that expose portions of the silicon-containing layer 206 to be removed by the subsequent etching process.

Figure 11:
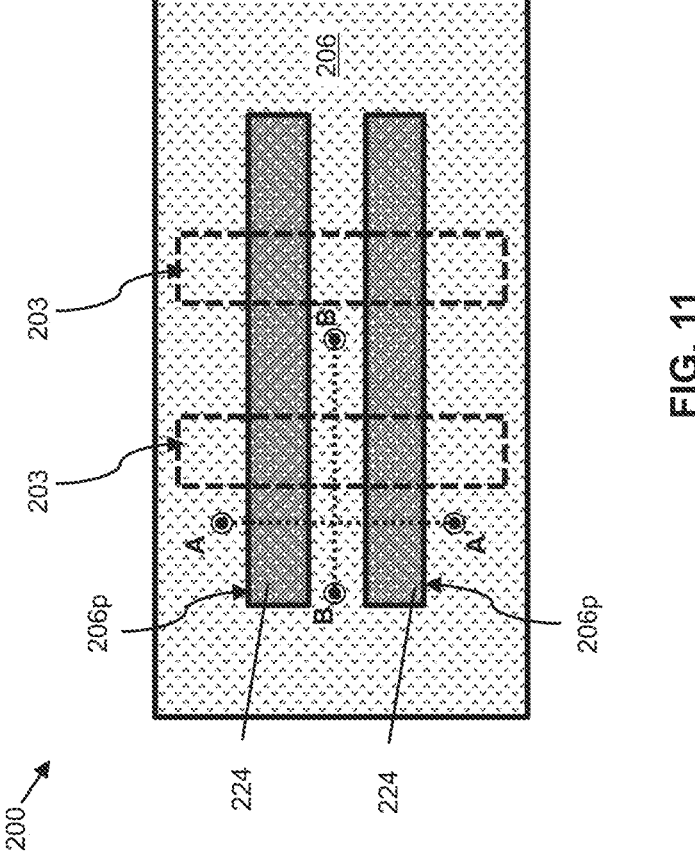

Referring to FIGS. 1 and 11-19 collectively, the method 100 at operation 110 performs an etching process 302 using an etchant 312 to remove portions of the silicon-containing layer 206, thereby forming the gate structures 206p separated by the trenches 214. As shown in FIGS. 11, 14, and 17, the resulting gate structure 206p are oriented lengthwise along the Y axis, substantially perpendicular to the lengthwise direction of the fins 203. In the present implementations, a portion of the gate structure 206p overlays the channel region of the fin 203, while another portion (e.g., an end portion or a portion between two adjacent fins 203) of the gate structure 206p overlays the dielectric layer 204.

Figures 12, 13:
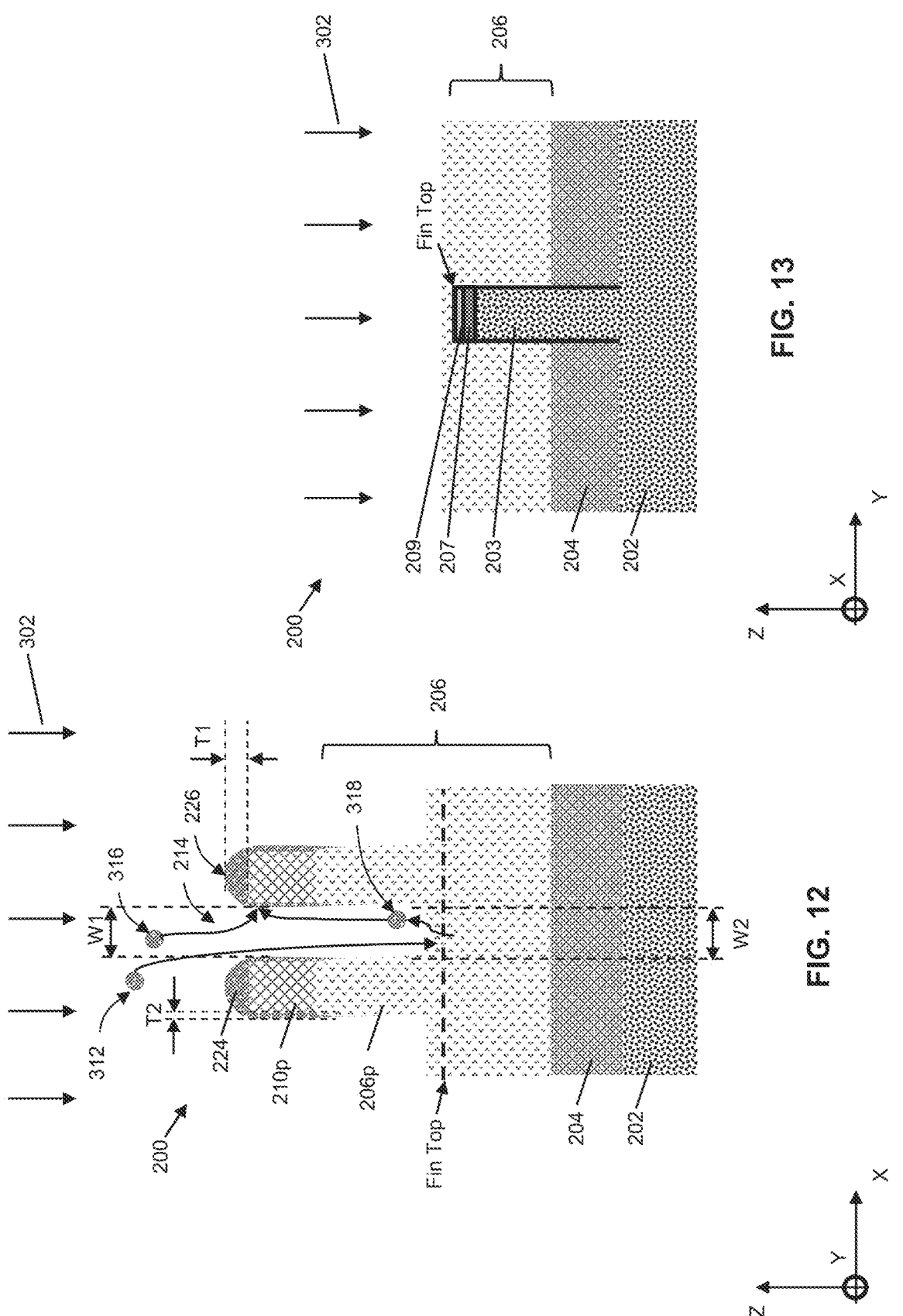

The etching process 302 is depicted in detail at three intermediate stages in FIGS. 11-13, FIGS. 14-16, and FIGS. 17-19, respectively. For example, FIGS. 11-13 depict a first intermediate stage of the etching process 302 during which a top portion of the silicon-containing layer 206 is removed without exposing the second hard mask 209. In other words, the etching process 302 stops at a position above the fin top of the fin 203, as indicated in FIGS. 12 and 13, such that a portion of the silicon-containing layer 206 remains over the fins 203.

FIGS. 14-16 depict a second intermediate stage of the etching process 302 during which a subsequent portion of the silicon-containing layer 206 is removed by the etching process 302 to expose a top portion (e.g., the fin top and top portion of sidewalls) of the fin 203, without exposing the underlying dielectric layer 204. In other words, a bottom portion of the silicon-containing layer 206 remains over the dielectric layer 204, as depicted in FIGS. 15 and 16.

Figures 18, 19:
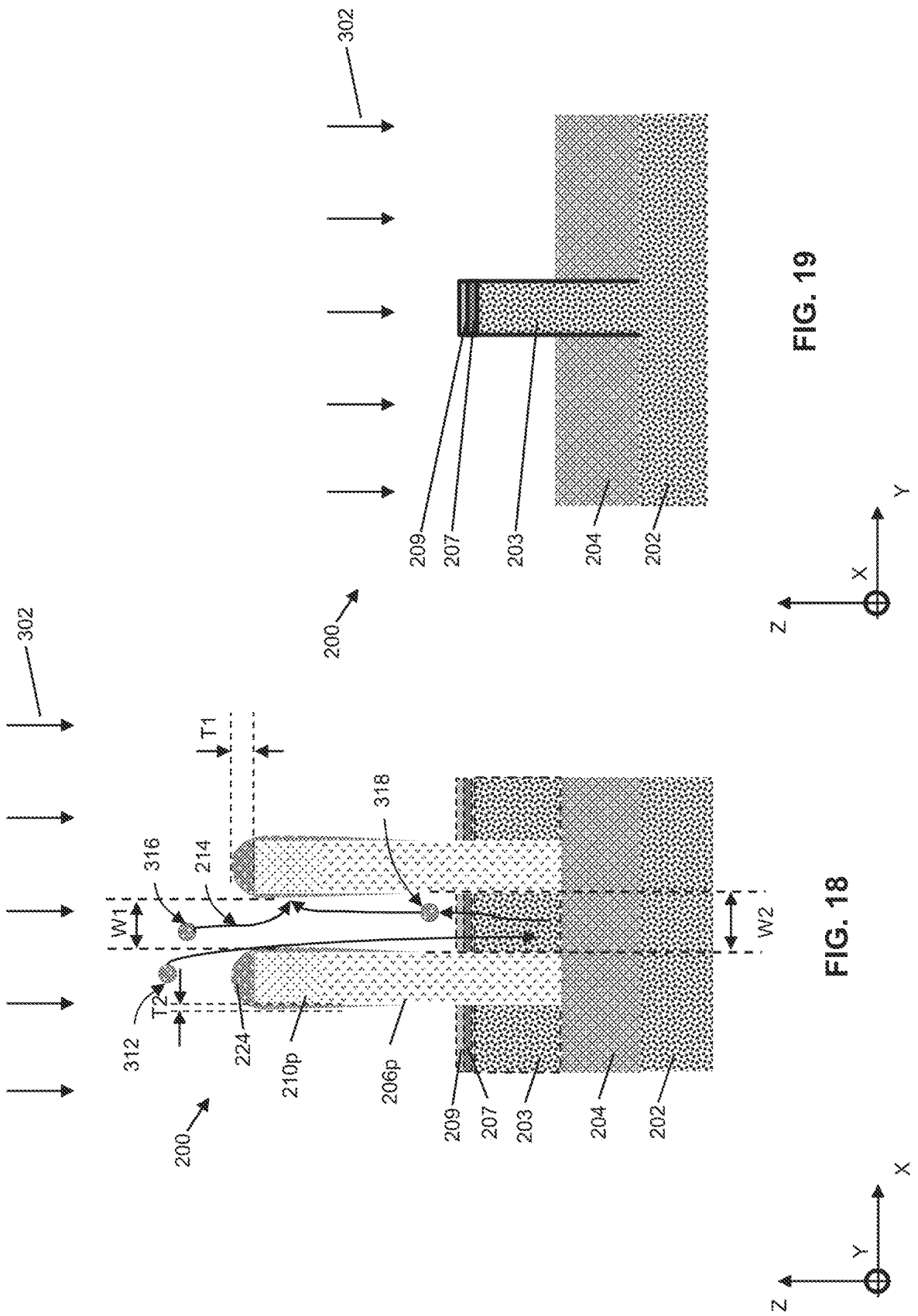
Figures 21, 22:
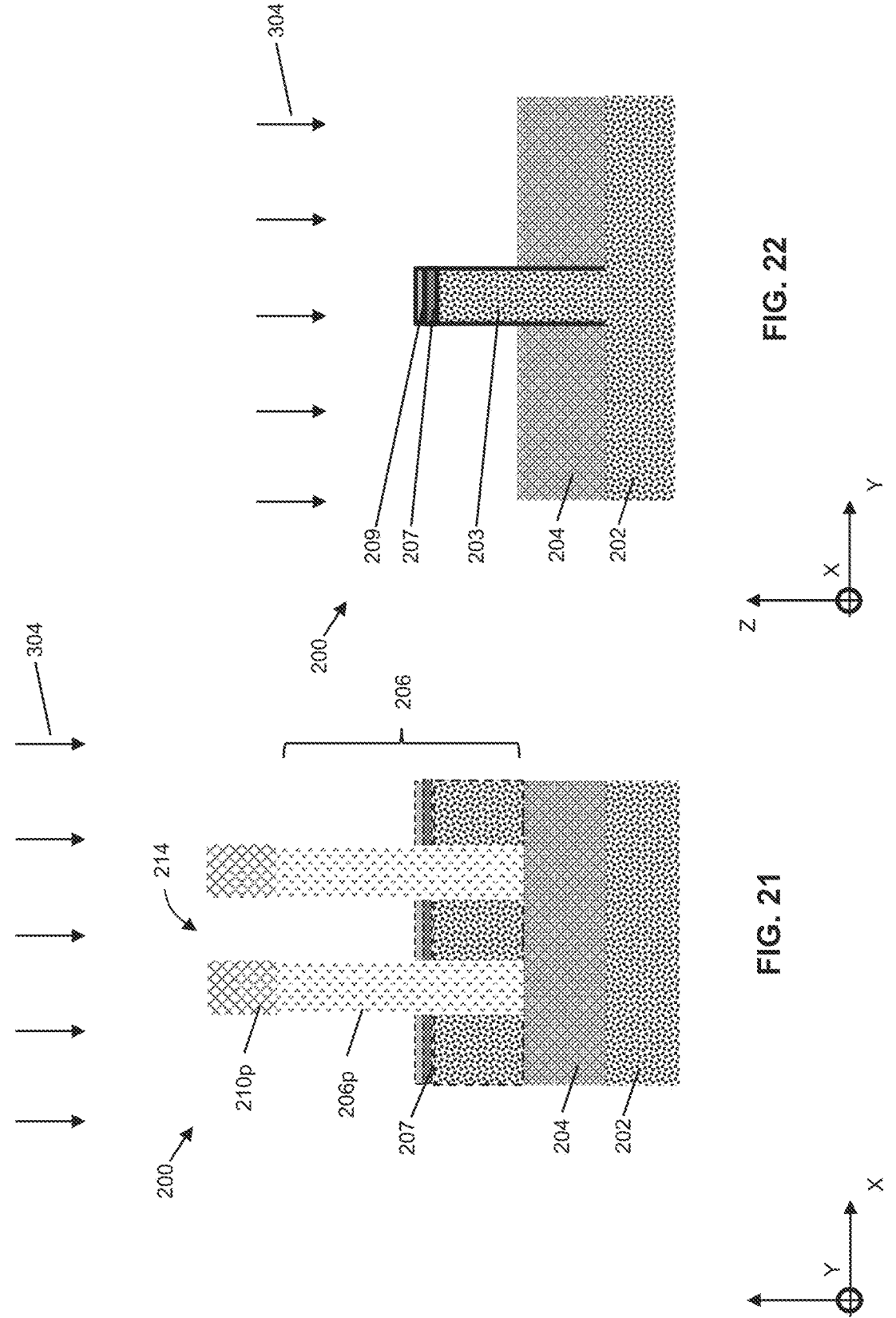

FIGS. 17-19 depict a third intermediate stage of the etching process 302 during which remaining portions of the silicon-containing layer 206 not underlying the patterned mask 210p are completely removed by the etching process 302 to expose the dielectric layer 204 in the trenches 214. The etching process 302 is performed continuously from the first intermediate stage to the second intermediate stage and the third intermediate stage using the same etchant (e.g., etchant 312). Referring to FIGS. 15 and 18, portions of the second hard mask 209, the first hard mask 207, and the fin 203 are outlined in dashed borders to indicate that they are disposed behind the gate structure 206p in the cross-sectional view through the X-Z plane.

Referring to FIGS. 12, 15, and 18, the etching process 302 may be any suitable etching process, such as a dry etching process implemented using a chemically reactive plasma. In this regard, the etching process 302 is considered an RIE process. In some implementations, the etching process 302 is performed using the etchant 312 configured to react with the silicon-containing layer 206 but not react, or substantially react, with the patterned mask 210p, the dielectric layer 204, or the second hard mask 209.

In some implementations, the etchant 312 includes a chlorine-containing gas (e.g., $Cl_2$, $SiCl_4$, $BCl_3$, the like, or a combination thereof), a bromine-containing gas (e.g., HBr), the like, or combinations thereof. In an example implementation, the etchant 312 includes $Cl_2$ and HBr. In another example implementation, the etchant 312 includes $Cl_2$, HBr, and $SiCl_4$. Other etchants may also be applicable according to implementations of the present disclosure. In some implementations, the etchant 312 may additionally include a carrier gas, a diluent gas, or a combination thereof. For example, the etchant 312 may include argon (Ar).

Still referring to FIGS. 12, 15, and 18, the chemically reactive plasma implemented at the etching process 302 further includes a passivant 316 configured to react with the silicon-containing layer 206. In the present implementations, the passivant 316 includes a silicon-containing gas and a nitrogen-containing gas, such as $N_2$, and is free, or substantially free, of any oxygen-containing gas, such as $O_2$. The silicon-containing gas may include any suitable composition capable of forming a silicon nitride-containing compound with the nitrogen-containing gas. In some implementations, the silicon-containing gas also includes a halogen, such as Cl, F, the like, or combinations thereof. For example, the silicon-containing gas may include $SiCl_4$, $SiF_4$, the like, or combinations thereof. In one example implementation, the passivant 316 includes $SiCl_4$ and $N_2$ and is free of $O_2$. In another example implementation, the passivant 316 includes $SiF_4$ and $N_2$ and is free of $O_2$. As will be discussed in detail below, the passivant 316 includes a gas, such as $SiCl_4$, that selectively reacts with silicon and has the same composition as a product of the etching process 302. In some implementations, components of the passivant 316 are deposited over the semiconductor structure 200 by any suitable process, such as by CVD, ALD, the like, or combinations thereof, during the etching process 302.

In the present implementations, the nitrogen-containing gas of the passivant 316, such as $N_2$, reacts with the silicon-containing layer 206 and the etchant 312, including $Cl_2$ and HBr, to form halogen-containing silicon nitrides with generic formulae $Si_xNCl_y$ and $Si_xNBr_y$, respectively, as reaction by-products. For example, a chemical reaction between the silicon-containing layer 206, the etchant 312, and the passivant 316 may be described by Formula I:

$$Si+Cl_2+HBr+N_2+SiCl_4 \rightleftarrows SiCl_4+SiBr_4+Si_xNCl_y+ \\ Si_xNBr_y \tag{I},$$

or by Formula II:

$$Si+Cl_2+HBr+N_2+SiF_4 \rightleftarrows SiF_4+SiBr_4+Si_xNF_y+ \\ Si_xNBr_y \tag{II},$$

depending on the composition of the passivant 316 (e.g., the composition of the silicon-containing gas), where x>0, y>0, and values of x and y satisfy stoichiometric ratios suitable for the respective chemical formulae. In this regard, the polysilicon of the silicon-containing layer 206, the etchant 312 (e.g., $Cl_2$ and HBr), and the passivant 316 (e.g., $N_2$ and $SiCl_4$ or $SiF_4$, etc.) react to form products 314, which include $SiCl_4$ and $SiBr_4$, and by-products 318, which include $Si_xN$-$Cl_y$ or $SiNF_y$ and $Si_xNBr_y$. In the present implementations, the products 314 and the by-products 318 are free, or substantially free, of any oxygen-containing material.

In the present implementations, the by-products 318 including the halogen-containing silicon nitrides are deposited as a passivation layer 224 over the patterned mask 210p and at least portions of the sidewalls of the gate structures 206p. In some implementations, the passivation layer 224 is formed to a vertical thickness T1 over the patterned mask 210p. In some implementations, the passivation layer 224 is formed to have a domed (e.g., substantially hemispherical) profile 226 over a top surface of the patterned mask 210p. In some implementations, a lateral thickness T2 of the passivation layer 224 measured along the X axis (i.e., a sidewall thickness) decreases from the patterned mask 210p towards the substrate 202 (e.g., from top to bottom of the gate structures 206p). In one example, sidewalls of a lower portion (e.g., a portion proximal to the substrate 202) of the gate structures 206p may be covered by the passivation layer 224 and are therefore not exposed to the etchant 312. In another example, the sidewalls of the lower portion of the gate structures 206p may be free of any passivation layer 224 and are therefore exposed to the etchant 312. Stated differently, a width W1 near atop opening of the trench 214 is less than a width W2 near a bottom opening of the trench 214. In some implementations, the vertical thickness T1 is greater than a largest value of the lateral thickness T2, which is measured near the top opening of the trench 214.

In the present implementations, the passivation layer 224 has a composition that differs from that of the silicon-containing layer 206, the patterned mask 210p, and the second hard mask 209. Accordingly, an etching selectivity between the passivation layer 224 and the silicon-containing layer 206 (and the other surrounding features) increases as the thickness (e.g., the thickness T1 and/or the thickness T2) of the passivation layer 224 increases. In some instances, an increased etching selectivity improves protection of the silicon-containing layer 206 against inadvertent over-etching, which may lead to non-vertical sidewall profiles. In some implementations, a ratio of the thickness T2 to the thickness T1 remains relatively constant during the first intermediate stage (FIGS. 11-13), the second intermediate stage (FIGS. 14-16), and the third intermediate stage (FIGS. 17-19), to provide protection against over-etching throughout the etching process 302.

While increasing the thickness of the passivation layer 224 improves the etching selectivity between the silicon-containing layer 206 and the passivation layer 224, an excess amount of the passivation layer 224 may inadvertently narrow or clog the top opening of the trench 214, thereby limiting an amount of the etchant 312 provided to the bottom of the trench 214 and leading to incomplete removal of the silicon-containing layer 206 between adjacent gate structures 206p. Such incomplete removal may cause the bottom portions of the gate structures 206p to have a footed profile, which deviates from the substantially vertical profile of the sidewalls of the gate structures 206p. In this regard, the composition and amount (e.g., flow) of the passivant 316 is adjusted such that the passivation layer 224 is formed to a thickness that would not cause the clogging of the trench 214 and that would also result in sufficient etching selectivity to protect the substantially vertical profile of the sidewalls of the gate structures 206p.

In the present implementations, a rate of forming the passivation layer 224 using $N_2$ as the passivant 316 is generally less than a rate of forming a passivation layer using $O_2$ as a passivant, which is implemented in existing technologies. Such a reduction in rate of reaction may in turn reduce the thickness (e.g., the vertical thickness T1 and/or the lateral thickness T2) of the passivation layer 224 and, consequently, the occurrence of clogging of the trench 214. To improve the etching selectivity between the silicon-containing layer 206 and the passivation layer 224 at a reduced thickness, $SiCl_4$, which can selectively etch silicon of the silicon-containing layer 206 with respect to the passivation layer 224, is added to the passivant 316. It is noted that $SiCl_4$ is also a part of the products 314 of the reaction according to Formula I. Accordingly, by adjusting the composition and flow of the passivant 316, the thickness of the passivation layer 224 as well as the etching selectivity of the silicon-containing layer 206 may be improved.

In addition to controlling the flow of the passivant 316, other conditions of the etching process 302 may also be adjusted to control the formation of the passivation layer 224. For example, a source power and a bias power applied to the chemically reactive plasma may be adjusted to any value less than about 3000 W.

Referring to FIG. 1, the method 100 at operation 112 performs additional operations to the semiconductor structure 200. For example, referring to FIGS. 20-22, the method 100 at operation 112 may perform a cleaning process 304 to selectively remove the passivation layer 224 from the patterned mask 210p and the sidewalls of the gate structures 206p. Alternatively or additionally, the method 100 at operation 112 may form source/drain features (not depicted) in and/or over the fin 203 adjacent the gate structure 206p.

As provided herein, the present disclosure relates to methods of etching a silicon-containing layer with improved etching selectivity and profile control. For example, the present implementations provide an etching process (e.g., the etching process 302) that utilizes an etchant (e.g., the etchant 312) and a passivant (e.g., the passivant 316) in a reactive plasma to etch a trench (e.g., the trench 214) in a silicon layer (e.g., the silicon-containing layer 206) and form a gate structure (e.g., the gate structure 206p) overlaying a semiconductor fin (e.g., the fin 203). In some implementations, the passivant includes $N_2$ and $SiCl_4$ that react with the silicon layer and the etchant to form halogen-containing silicon nitrides (e.g., the by-products 318) deposited as a passivation layer (e.g., the passivation layer 224) over the gate structure and its hard mask (e.g., the patterned mask 210p). In comparison to existing technologies, the halogen-containing-silicon-nitride-based passivation layer of the present disclosure may be formed at a lower rate to reduce potential clogging at an opening of the trench, thereby improving an etched profile of a bottom portion of the gate structure. In addition, by introducing $SiCl_4$ in the passivant, the etching selectivity between the silicon layer and the passivation layer may also be enhanced. Still further, the etching process of the present disclosure may be implemented in a one-step process rather than a series of etching processes, which improves the throughput of the fabrication process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
   providing a semiconductor substrate;
   forming a fin protruding from the semiconductor substrate;
   forming a silicon-containing layer over the fin; and
   patterning the silicon-containing layer to form a gate structure over the fin, wherein patterning the silicon-containing layer is implemented using an etchant and a passivant that includes a silicon-containing gas and a nitrogen-containing gas.

2. The method of claim 1, wherein the silicon-containing gas includes a halogen and the nitrogen-containing gas includes $N_2$.

3. The method of claim 1, wherein the passivant is free of any oxygen-containing gas.

4. The method of claim 1, further comprising forming a patterned mask over the silicon-containing layer such that patterning the silicon-containing layer removes portions of the silicon-containing layer exposed by the patterned mask.

5. The method of claim 1, wherein patterning the silicon-containing layer causes the passivant to react with silicon-containing layer to form a passivation layer that includes at least one silicon nitride (SiN)-containing material.

6. The method of claim 5, wherein the passivation layer includes $Si_xNBr_y$, and one of $Si_xNCl_y$, or $Si_xNF_y$, x and y being greater than 0.

7. The method of claim 5, wherein a portion of the passivation layer is formed to have a thickness that decreases along a sidewall of the gate structure towards the semiconductor substrate.

8. The method of claim 5, wherein a portion of the passivation layer is formed to have a domed profile over a top surface of the gate structure.

9. A method, comprising:
   providing a semiconductor substrate;
   forming a fin protruding from the semiconductor substrate;
   depositing a silicon layer over the fin; and
   etching the silicon layer to form a gate structure using an etchant and a passivant, wherein etching the silicon layer forms a silicon-nitride-containing passivation layer over a top portion of a sidewall of the gate structure, wherein the silicon-nitride-containing passivation layer includes at least one halogen-containing silicon nitride.

10. The method of claim 9, further comprising:

forming a patterned mask over the silicon layer before etching the silicon layer; and removing the silicon-nitride-containing passivation layer after etching the silicon layer.

11. The method of claim 9, wherein etching the silicon layer includes depositing the passivant using a chemical vapor deposition (CVD) process.

12. The method of claim 9, wherein a bottom portion of the sidewall of the gate structure is free of the silicon-nitride-containing passivation layer.

13. The method of claim 9, wherein a composition of the passivant is free of oxygen.

14. The method of claim 9, wherein the etchant includes $Cl_2$, HBr, or a combination thereof.

15. The method of claim 14, wherein the etchant reacts with the silicon layer to form a product having a same composition as the passivant.

16. A method, comprising:

providing a semiconductor substrate;

forming a fin protruding from the semiconductor substrate;

depositing a silicon layer over the fin;

forming a patterned mask over the silicon layer; and etching portions of the silicon layer exposed by the patterned mask to form a gate structure, wherein etching the portions of the silicon layer is implemented using an etchant and a passivant that includes a silicon-containing gas and a nitrogen-containing gas, resulting in a silicon-nitride-containing passivation layer over a sidewall of the gate structure.

17. The method of claim 16, wherein the passivant includes $N_2$ and a silicon-and-halogen-containing gas, the passivant being free of any oxygen-containing gas.

18. The method of claim 16, wherein the silicon-containing gas includes a halogen and the nitrogen-containing gas includes $N_2$.

19. The method of claim 16, wherein the silicon-nitride-containing passivation layer is formed to have a thickness that decreases along the sidewall of the gate structure below the patterned mask.

20. The method of claim 19, wherein a bottommost portion of the sidewall of the gate structure is free of the silicon-nitride-containing passivation layer.

* * * * *